United States Patent [19]
Rees et al.

[11] Patent Number: 5,810,072
[45] Date of Patent: Sep. 22, 1998

[54] FORCED AIR COOLER SYSTEM

[75] Inventors: Fenton Rees, Everett, Wash.; Larry Rinehart, San Jose, Calif.

[73] Assignee: SemiPower Systems, Inc.

[21] Appl. No.: 525,491

[22] Filed: Sep. 8, 1995

[51] Int. Cl.⁶ .................................................. H05K 7/20
[52] U.S. Cl. .......................... 165/80.3; 165/121; 257/722; 361/697
[58] Field of Search .................................. 165/80.3, 122, 165/185, 121; 174/16.3; 257/721, 722; 361/695, 697, 702

[56] References Cited

U.S. PATENT DOCUMENTS

| | | | |
|---|---|---|---|
| 4,699,208 | 10/1987 | Wolf et al. | 165/80.3 X |
| 4,953,634 | 9/1990 | Nelson et al. | 165/80.3 X |
| 5,077,601 | 12/1991 | Hatada et al. | 257/722 |
| 5,103,374 | 4/1992 | Azar . | |
| 5,195,576 | 3/1993 | Hatada et al. . | |
| 5,406,451 | 4/1995 | Korinsky . | |

FOREIGN PATENT DOCUMENTS

| | | | |
|---|---|---|---|
| 62-272559 | 11/1987 | Japan | 257/721 |
| 14298 | 1/1991 | Japan | 361/702 |
| 32255 | 2/1992 | Japan | 257/722 |
| 309294 | 10/1992 | Japan | 174/16.3 |
| 95062 | 4/1993 | Japan | 257/721 |
| 167282 | 7/1993 | Japan | 361/695 |
| 259325 | 10/1993 | Japan | 257/721 |

*Primary Examiner*—Leonard R. Leo
*Attorney, Agent, or Firm*—David H. Jaffer

[57] ABSTRACT

A forced air cooler system designed to maximize heat transfer from a heat generating source to an airflow and minimize the overall size of the cooler system wherein the system contains a fan, heat sink, and inlet plenum. The fan is placed adjacent to the heat sink. The plenum contacts the fan at an angle and then intersects with the heat sink to direct the airflow to an exhaust area.

3 Claims, 2 Drawing Sheets

FORCED AIR COOLER SYSTEM

BACKGROUND OF THE INVENTION

1. Field of the Invention

The invention relates generally to a forced air cooler system for maximizing heat removal from a heat generating component while minimizing the overall size of the cooler system. In particular, the invention relates to a forced air cooler system comprising a heat sink, fan, and an inlet plenum where the fan is placed adjacent to the heat sink and the inlet plenum is placed at an angle from the fan.

2. Brief Description of the Prior Art

Traditional airflow practices in forced air cooler systems teach placement of a plenum between the fan and heat sink cooling fins. The fan is typically located away from the cooling fins at a distance of at least one fan blade diameter to maximize the total volume of airflow. For a given heat exchanger, this maximizes the air velocity over the fin surfaces and presumably maximizes the heat transfer to the airflow.

It has been shown by experiment that this is not the optimum solution. Unfortunately, the deep plenum allows the airflow to be laminar over the fin surfaces and increases the overall size of the cooling system. While this maximizes air velocity by minimizing back pressure, it does not maximize heat transfer to the airflow. What is desired is to create turbulence in the airflow. Turbulent airflow picks up more heat from the metal fin surfaces. However, the means typically used to create turbulence in the airflow also increases back pressure and reduces the total fan airflow output.

Other heat sink and plenum configurations have been designed to maximize heat transfer.

Hatada et al. (U.S. Pat. No. 5,195,576) describe a cooling apparatus having fins and utilizing a turbulent airflow in conjunction with a laminar flow to cool an LSI package. A thin-wire heat sink is used and functions on the premise that airflow patterns are formed when one thin wire is removed from a group of thin wires. The airflow pattern is governed by Reynold's number which is defined by the flow velocity and the thin wire diameter. One of the embodiments of the invention has a plenum which divides the airflow into two streams: a main flow and a bypass flow. The plenum has a slit in it which allows air from the main flow to interact with air from the bypass flow. The main flow passes through the slit in the plenum and collides with the thin wire fins to cool the LSI package. After mixing with the bypass flow, the main flow is exhausted with the bypass flow exhaust.

Hatada et al. (U.S. Pat. No. 5,077,601) also describe a cooling system for cooling an electronic device wherein more than one airflow is used to cool radiating fins which are elongated and disposed along the longitudinal axis of the apparatus. The two airflows are formed by a plenum which is progressively tapered down toward the end of the flow passage.

Although Hatada et al. ('601) describe use of a plenum to create turbulence, the plenum does not intersect the airflows until the air is well downstream from the leading edge of the fins. Thus, the turbulent zone is created at the downstream edge of the fins and not in the center of the heat source where the majority of heat is generated. Additionally, neither Hatada et al. patents describe a heat sink and fan which are adjacent to each other.

Nelson et al. (U.S. Pat. No. 4,953,634) describe a heat sink, wherein longitudinally disposed fins are contained within a variable height chamber. The variable height chamber includes several embodiments designed to provide a lower pressure drop for the air flowing through the heat exchanger without sacrificing thermal performance.

The above described prior art show various types of heat sinks, airflow plenums, and chambers to minimize back pressure and maximize heat transfer. However, none of the prior art describe a forced air cooler system designed to maximize heat transfer and minimize the overall size of the cooler design.

The present invention is designed to both maximize heat transfer and to minimize the overall size of the forced air cooler design.

SUMMARY OF THE INVENTION

Accordingly, it is an object of the present invention to provide an inlet plenum and heat sink which are optimized to provide maximum heat transfer between the airflow and the heat sink while minimizing the overall size of the forced air cooler system.

It is a second object of the invention to provide a forced air cooler system wherein the fan is placed adjacent to the heat sink such that the fan is less than 1 fan blade diameter away from the heat sink and preferably is placed less than 1 fan blade radius away from the heat sink.

It is a third object of the invention to provide a forced air cooler system with an inlet plenum which directs a main flow component of the airflow to intersect with a plenum component of the airflow at the portion of the heat sink where the majority of the heat is contained.

Briefly, the preferred embodiment of the present invention is a forced air cooler system with a fan (contained within a housing) and a heat sink where the housing is placed adjacent to the heat sink. The heat sink has a height which is approximately half the height of the fan. An inlet plenum is provided which is adjacent to the housing and is placed at an angle θ of between 10° and 80° from the housing and preferably between 30° and 60° from the housing. The inlet plenum intersects with the bottom of the heat sink and continues across the heat sink to the end of the heat sink. Two distinct airflows are created: a main flow component and a plenum flow component. The two airflow components collide forming a zone of turbulence which maximizes the amount of heat transferred from the heat sink to the air. The combined airflow is then exhausted from the heat sink.

DETAILED DESCRIPTION OF THE PREFERRED EMBODIMENT

This invention provides a forced air cooler system which effectively transfers heat from a heat generating component, while minimizing the overall size of the air cooler system. The invention is suitable for use with a power semiconductor module or any other heat generating source.

Figure 1:
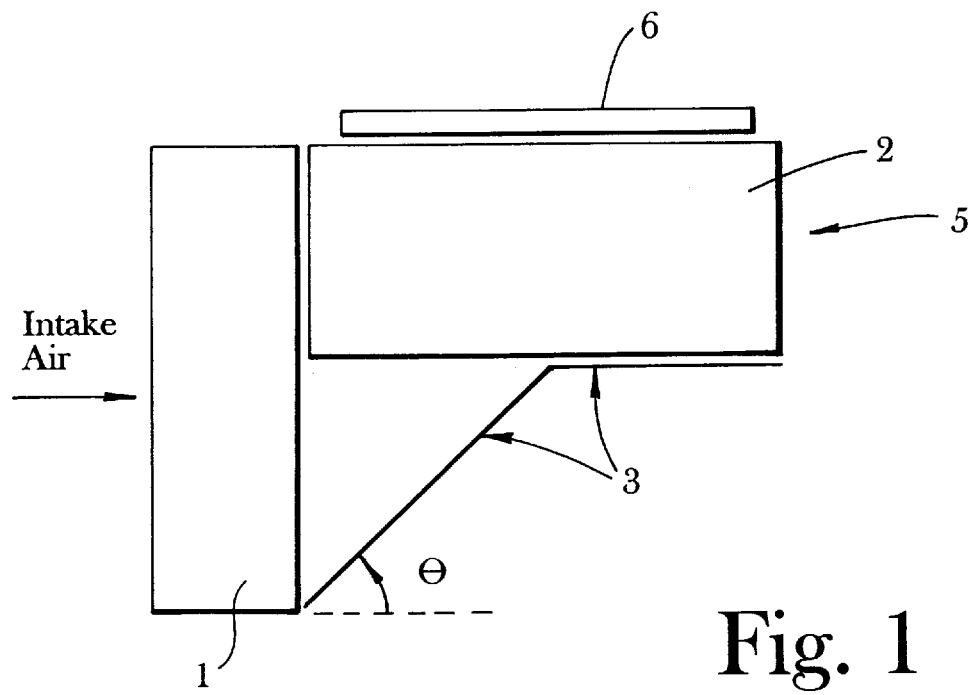
FIG. 1 is a sideview of the forced air cooler system.
Figure 2:
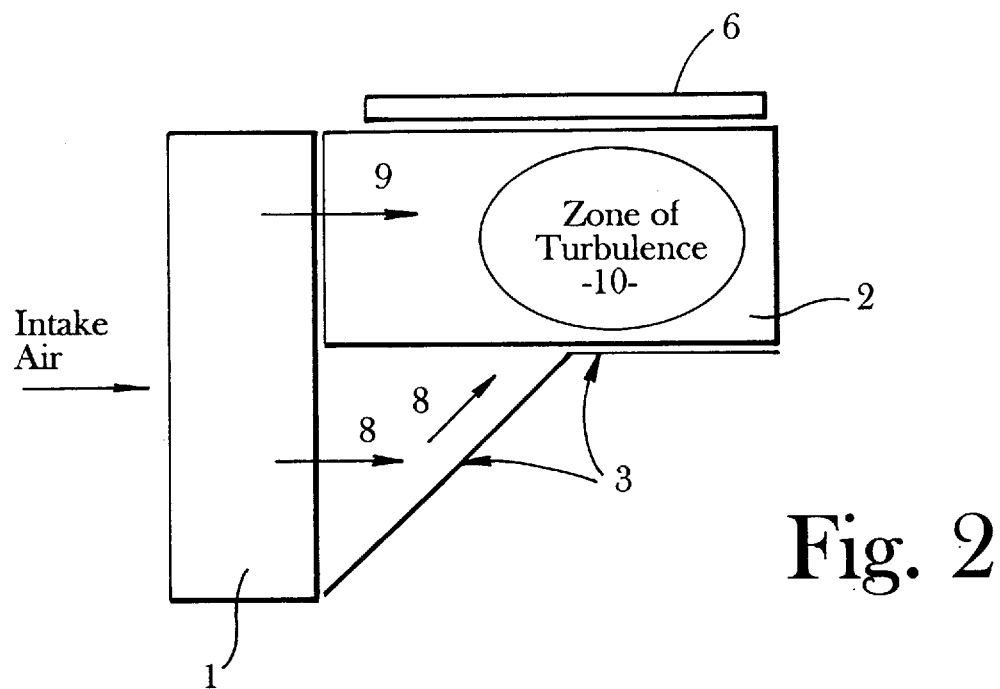
FIG. 2 is a sideview of the forced air cooler system showing the two airflows and the zone of turbulence.

With reference to FIG. 1, a forced air cooler system in accordance with the present invention is shown. Fan 1 (diameter of the fan is approximately 80 mm) is contained within a housing and is placed adjacent to heat sink 2. The fan is approximately 1 mm from the edge of the housing which is placed from between 0–1 mm away from the heat sink. Fan 1 directs the intake air into heat sink 2 and into inlet plenum 3. Inlet plenum 3 is placed at an angle θ of between 30° and 60° from the bottom of the housing and intersects with heat sink 2 and continues along the bottom of the heat sink to discharge area 5. Referring now to FIG. 2, by directing the airflow into the plenum and into the heat sink, two distinct airflows are formed: a main flow component 8 and a plenum flow component 9. The air from the top half of fan 1 flows directly into heat sink 2 at high back pressure resulting in a relatively low velocity airflow that becomes laminar within a relatively short distance (approximately 1 fan radius). The air from the bottom half of the fan flows into the open chamber formed by the plenum at a lower back pressure which results in a higher velocity airflow. The plenum forces these two airflow components to mix within the confines of the heat sink creating a distinct zone of turbulence 10 which extends for some distance increasing the heat transfer rate. In fact, the zone of turbulence can be created anywhere within the heat sink and more specifically, can be directed to the area under the power semiconductor module 6 which generates the most heat. In this way, the maximum amount of heat is dissipated.

In order to create the two airflow components, the fan diameter to fin height ratio must be greater than 1:1. If the ratio is less than 1:1, two distinct airflow components will not be created. If the ratio is too great there is a large amount of wasted space without a corresponding increase in the amount of heat dissipated from the fins. We have found that a ratio of from about 2:1 to about 3:1 yields optimal results for this invention.

Experimentation shows that moving the fan adjacent to the heat sink (less than 1 fan blade diameter and preferably less than 1 fan blade radius away) results in a 5–10% decrease in the volume of air moved by the fan (due to the increased back pressure and decreased fan efficiency) and a 10–15% increase in heat transferred to the airflow evidenced by a decrease in measured thermal resistance of the forced air cooler system. At the same time, by moving the fan directly adjacent to the heat sink, the total size of the forced air cooling system is significantly reduced.

Figure 3:
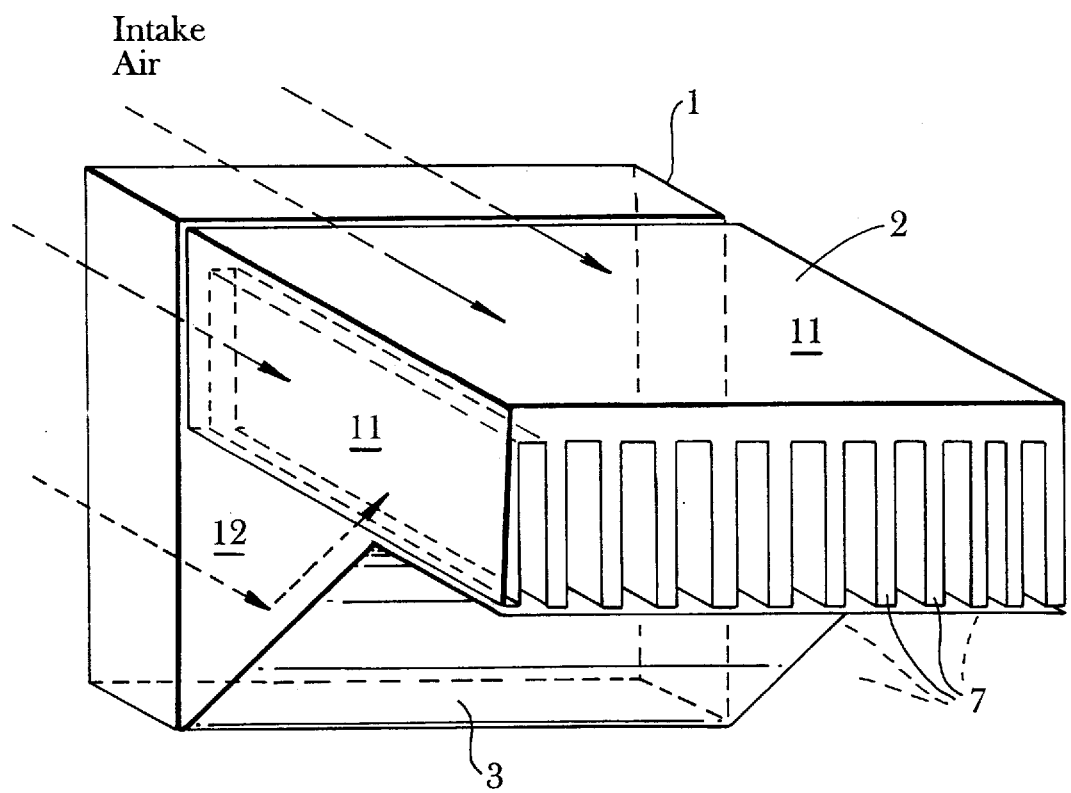
FIG. 3 is a perspective view of the forced air cooler system.

The structure of the heat sink has been designed to minimize the size of the heat sink while maximizing the amount of heat transferred from the heat sink. The heat sink is made of extruded aluminum, copper, or other high heat conducting metal with the length of the fins and the spacing between them designed to maximize heat transfer while minimizing the size of the heat sink. Referring to FIG. 3, heat sink 2 is made up of tabular fins 7 arranged in parallel with each other and extending in the direction of the flow of the cooling air. Plenum 3 intersects with heat sink 2 and continues along the bottom of fins 7. The heat sink, fan and inlet plenum may be placed into any type of housing arrangement which encloses open portion 12 between the sides 11 of heat sink 2 and inlet plenum 3.

In a preferred embodiment of the invention, the heat sink is made up of approximately 14 fins which are approximately 5 inches long, 0.08 inches wide, 1.25 inches tall, and approximately 0.25 inches apart. The ratio of fin height to distance between the fins is approximately 6. The fan is approximately 80 mm in diameter and is placed within a housing at a distance of about 1 mm from the edge of the housing, where the housing is placed from about 0 to about 1 mm from the heat sink. The fan is able to produce approximately 36 cubic feet per minute (CFM) at zero pressure. Other commercially available fan diameters include 40 mm, 60 mm, 92 mm, and 120 mm which may be paired with heat sinks to match the fan size.

The inlet plenum may be formed from sheet metal, cardboard, nomex, or any other material capable of directing the flow of air into the heat sink.

EXAMPLES

Example 1

An 80 mm diameter fan within a housing was placed 0.73 mm away from an aluminum heat sink measuring approximately 5 inches by 5 inches, with fins 5 inches long by 0.08 inches wide, 1.25 inches tall, and approximately 0.25 inches apart. An inlet plenum was placed against the fan housing at an angle of 45° which then intersected with the heat sink and continued to the end of the heat sink. A power semiconductor module was placed on top of the heat sink, the fan at rated voltage produced an airflow of 25 CFM, and the thermal resistance R was measured. The thermal resistance R was found to be 0.22° C./w.

Example 2

The same configuration as described in Example 1 was used in this example, with the exception of the inlet plenum which was placed at a 90° angle from the fan housing (essentially allowing no air to flow through the bottom of the fan) and the airflow was reduced to 13 CFM. The thermal resistance R was found to be 0.29° C./w.

Example 3

The same heat sink and fan described in Example 1 was used in this example. The placement of the fan within a housing was approximately 80 mm from the heat sink. The inlet plenum was placed at approximately a 30° angle from the bottom of the housing and intersected the heat sink at the front end of the heat sink (as opposed to the middle of the heat sink as in Example 1). The inlet plenum then continued across the bottom of the heat sink to the exhaust. The fan produced an airflow of 27 CFM. The thermal resistance R was measured and found to be 0.24° C./w.

Example 1 describes a preferred embodiment of the present invention, Examples 2 and 3 describe embodiments of the prior art. Example 1 produced a thermal resistance of 0.22° C./w. Example 2 described a 90° plenum where essentially half of the fan was blowing air into a wall. This produced a thermal resistance of 0.29° C./w, which is approximately 20% less efficient than Example 1. Similarly, Example 3 described placement of the fan away from the heat sink (approximately 1 fan blade diameter) with a measured thermal resistance of 0.24° C./w which is approximately 10% less efficient than Example 1 even though the airflow was 22% greater.

These examples illustrate that the present invention provides a decrease in the thermal resistance of between 10 and 20% over the prior art.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A forced air cooler system for optimizing heat transfer from a heat generating source to an airflow while reducing the overall size of the forced air cooler system comprising:

(a) a heat sink having a plurality of tabular fins arranged in parallel with each other extending from a heat sink base to a fin height defining a top of the heat sink, the fins extending from a first end in a direction parallel to the base to a second end for a distance of a fin length;

(b) a fan including a blade with a blade diameter selected so that the ratio of the blade diameter to the fin height is between 1.5:1 and 3:1, the fan positioned with the blade a distance from the first end less than one blade diameter, whereby the fan directs air flow parallel to the fin length, a lower portion of the fan directing a first component of air into the first end, and an upper portion of the fan directing a second component of air in a direction parallel to the fin length and above the fins; and (c) a plenum extending from the fan at an angle to intersect the top of the heat sink at a point between the first and second ends, the plenum directing the second component of air to enter between the fins so that the first component of air interacts with the second component of air to create a zone of air turbulence between the fins for enhancing heat transfer from the fins to the air.

2. A forced air cooler system according to claim 1 wherein said angle is between 10 and 80 degrees.

3. A forced air cooler system according to claim 1 wherein said angle is between 30 and 60 degrees.

* * * * *